(12) United States Patent
Vandentop et al.

(10) Patent No.: US 7,821,073 B2
(45) Date of Patent: Oct. 26, 2010

(54) PATTERNED BACKSIDE STRESS ENGINEERING FOR TRANSISTOR PERFORMANCE OPTIMIZATION

(75) Inventors: Gilroy J. Vandentop, Tempe, AZ (US); Rajashree Baskaran, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 246 days.

(21) Appl. No.: 12/061,935

(22) Filed: Apr. 3, 2008

(65) Prior Publication Data

US 2008/0237729 A1    Oct. 2, 2008

Related U.S. Application Data

(62) Division of application No. 10/949,463, filed on Sep. 24, 2004, now Pat. No. 7,371,630.

(51) Int. Cl.
  *H01L 27/092* (2006.01)
(52) U.S. Cl. .............................. 257/369; 257/E27.062
(58) Field of Classification Search ................. 257/369, 257/707, E27.062, 375, E21.476, E21.249
  See application file for complete search history.

(56) References Cited

U.S. PATENT DOCUMENTS

| | | | |
|---|---|---|---|
| 7,081,669 B2* | 7/2006 | Fitzgerald et al. | 257/707 |
| 2003/0162368 A1* | 8/2003 | Connell et al. | 438/465 |
| 2004/0075148 A1* | 4/2004 | Kumagai et al. | 257/369 |
| 2006/0199353 A1* | 9/2006 | Kub et al. | 438/455 |

* cited by examiner

*Primary Examiner*—Thomas L Dickey
*Assistant Examiner*—Fazli Erdem
(74) *Attorney, Agent, or Firm*—Dave L. Guglielmi

(57) ABSTRACT

Some embodiments of the present invention include selectively inducing back side stress opposite transistor regions to optimize transistor performance.

5 Claims, 5 Drawing Sheets

PATTERNED BACKSIDE STRESS ENGINEERING FOR TRANSISTOR PERFORMANCE OPTIMIZATION

CLAIM OF PRIORITY

This application is a divisional of and claims priority to U.S. patent application Ser. No. 10/949,463 filed on Sep. 24, 2004 now U.S. Pat. No. 7,371,630 entitled "Patterned Backside Stress Engineering for Transistor Performance Optimization," which is incorporated herein by reference in its entirety.

TECHNICAL FIELD

This invention relates to semiconductor technology. In particular, the present invention relates to methods and apparatus for transistor optimization by stress engineering.

BACKGROUND

In semiconductor processing, transistors may be formed on semiconductor wafers. The transistors may include a gate electrode, a source, a drain, and a channel region and may be NMOS (N Channel Metal Oxide Semiconductor) or PMOS (P Channel Metal Oxide Semiconductor) transistors. The transistors and other devices may be interconnected to form integrated circuits (ICs). The ICs may then be packaged and sold to the public. The performance of the ICs may depend on the performance of the transistors.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, an apparatus and method relating to inducing back side stresses on transistor regions are described. In the following description, various embodiments will be described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn. However, the order of description should not be construed as to imply that these operations are necessarily order dependent. In particular, these operations need not be performed in the order of presentation.

Stress engineering transistor channels may provide enhanced transistor performance. For example, NMOS (N Channel Metal Oxide Semiconductor) transistor performance may improve when the channel region of the NMOS transistor is under tensile stress while PMOS (P Channel Metal Oxide Semiconductor) transistor performance may improve when the channel region of the PMOS transistor is under compressive stress. Stress engineering may be broadly defined as providing tensile or compressive stress to a material. Briefly, embodiments of the present invention may include independently inducing stress on transistors from the back side of a substrate. More specifically, different back side stresses may be selectively applied to NMOS and PMOS transistor channels.

Figure 1:
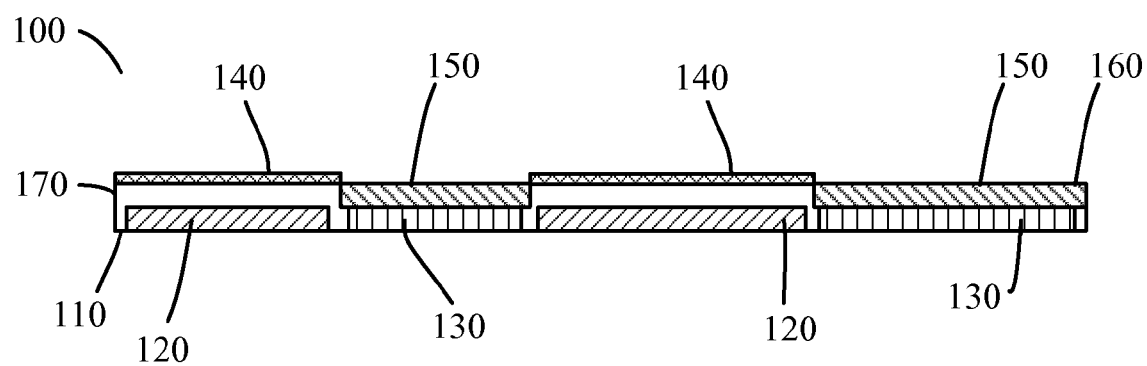
FIG. 1 illustrates a cross sectional type view of an apparatus in accordance with one embodiment of the present invention.

FIG. 1 illustrates a cross-sectional type view of an apparatus 100. Apparatus 100 includes a substrate 170 having a front surface 110 and a back surface 160. Front surface 110 may include NMOS transistor regions 120 and PMOS transistor regions 130. Substrate 170 may also include NMOS back side stress engineering areas 140 and PMOS back side stress engineering areas 150. FIG. 1 illustrates back side stress engineering areas 140, 150 on a substrate surface opposite the NMOS and PMOS transistor regions 120, 130, as further discussed below.

An example of the present invention having NMOS back side stress engineering areas 140 formed on the back surface 160 opposite NMOS transistor regions 120 and PMOS back side stress engineering areas 150 formed under the back surface 160 opposite PMOS transistor regions 130 is illustrated. In other embodiments, back side stress engineering areas 140, 150 may both be formed under the back surface 160 or both may be formed on the back surface 160. In other embodiments, only one back side stress engineering area may be formed opposite one transistor type region. Further, the disclosed invention is not limited to NMOS and PMOS transistor type regions or only two transistor type regions. In other embodiments, more than two stress engineering areas may be selectively formed opposite more than two transistor type regions. In yet other embodiments, the NMOS transistors, the PMOS transistors, or both may include transistors having stress engineering performed during front side transistor fabrication. Many other embodiments, such as different back side stress engineering areas patterned over the same transistor type regions, may also be available by the methods of the present invention.

Figure 2A:
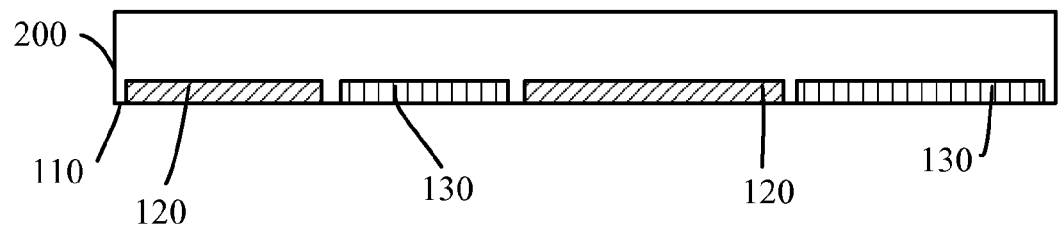
FIGS. 2A-2I illustrate cross sectional type views of a method in accordance with one embodiment of the present invention.

FIGS. 2A-2I illustrate a method, according to one embodiment of the invention. Referring first to FIG. 2A, NMOS transistor regions 120 and PMOS transistor regions 130 may be formed on front surface 110 of a starting substrate 200 by known methods. Starting substrate 200 may be a wafer or a die and may include monocrystalline silicon, silicon on insulator, or other suitable materials. Starting substrate 200 may also include other layers or structures (not shown) that comprise insulative, conductive, or semiconductive materials, such as vias, dielectrics, metal traces, bumps, and others. FIG. 2A illustrates transistor regions 120, 130 separated by a gap for clarity. In other embodiments, transistor regions 120, 130 may be immediately adjacent to each other or they may be separated by trenches, for example.

Figure 2B:
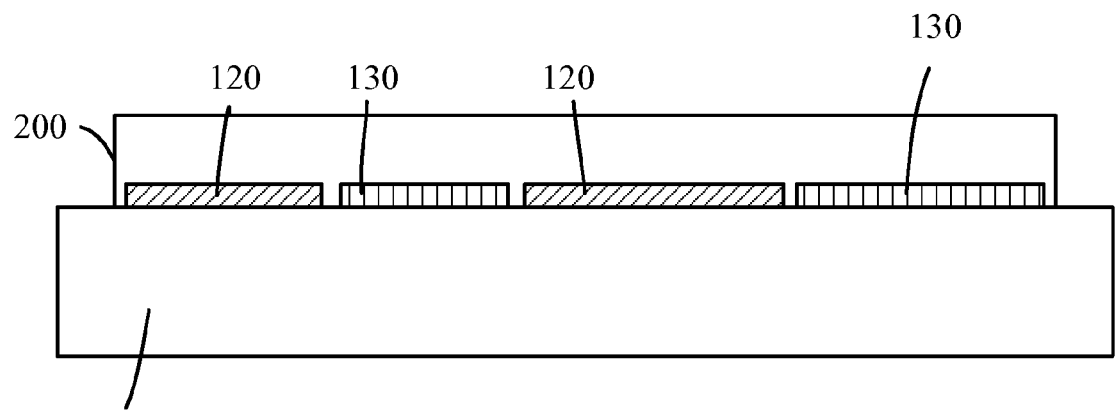
Figure 2C:
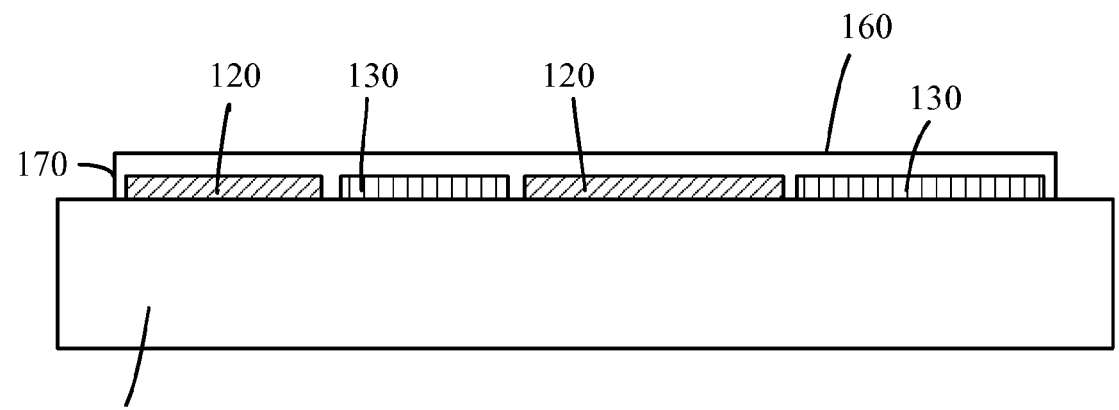

The method may continue by mounting front surface 110 to a wafer support system 210 by known methods as illustrated in FIG. 2B. Starting substrate 200 may be thinned by known methods to form a substrate 170 having a back surface 160 as illustrated in FIG. 2C. In one embodiment, a diffusion barrier (not shown) including Titanium, Nickel, or other suitable materials may be formed on back surface 160. The diffusion barrier may provide a seed layer for subsequent Copper plating. In other embodiments, the substrate may not be thinned or may not have a diffusion barrier formed thereon.

Figure 2D:
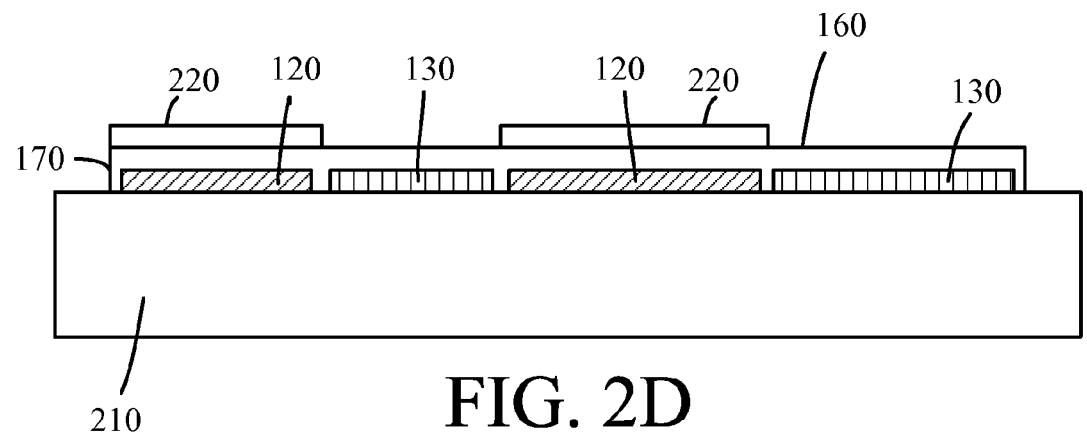

In FIG. 2D, a pattern 220 may be formed over back surface 160 of substrate 170. In one embodiment, pattern 220 may selectively cover backside areas opposite NMOS transistor regions 120 while exposing PMOS transistor regions 130. Pattern 220 may be formed by a photo-patterning process using a photoresist or a laminate or by a reductive thin film deposition, lithography, and etch process. In one embodiment, wafer support system 210 may be made of glass or other suitable material and pattern 220 may be aligned to transistor regions 120, 130 by using optical pattern recognition through wafer support system 210.

Figure 2E:
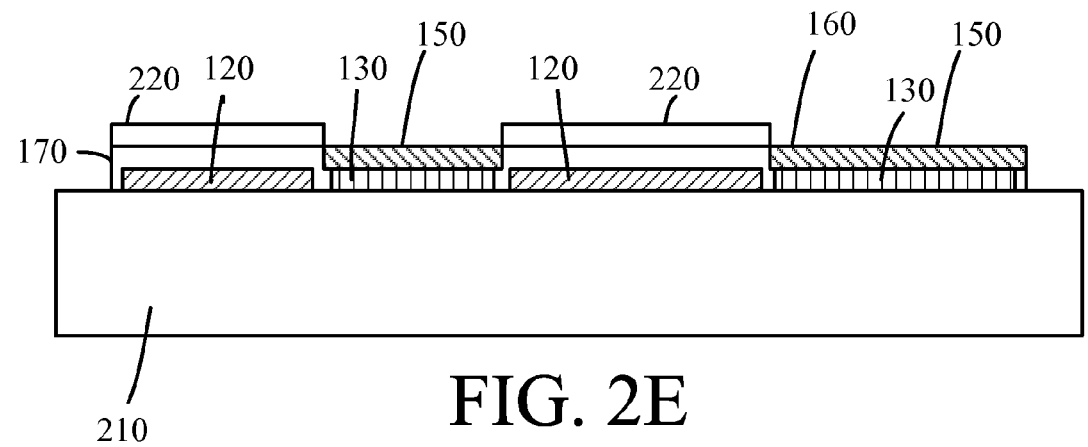
Figure 2F:
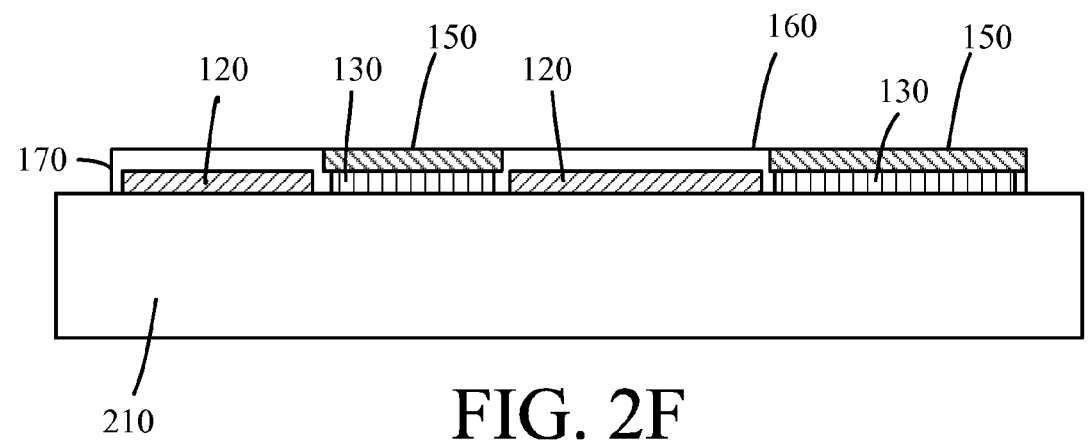

The method may continue in FIG. 2E by forming PMOS back side stress engineering areas 150 opposite PMOS transistor regions 130. PMOS back side stress engineering areas 150 may be formed under back surface 160 (as illustrated) or on back surface 160. In one embodiment, PMOS back side stress engineering areas 150 may be formed by atomic implant. In one embodiment, the atomic implant may include Germanium to provide a compressive stress on the transistor channels of the transistors in PMOS transistor regions 130. In other embodiments, PMOS back side stress engineering areas 150 may include a thin film layer. As shown in FIG. 2F, pattern 220 may be removed by known methods.

Figure 2G:
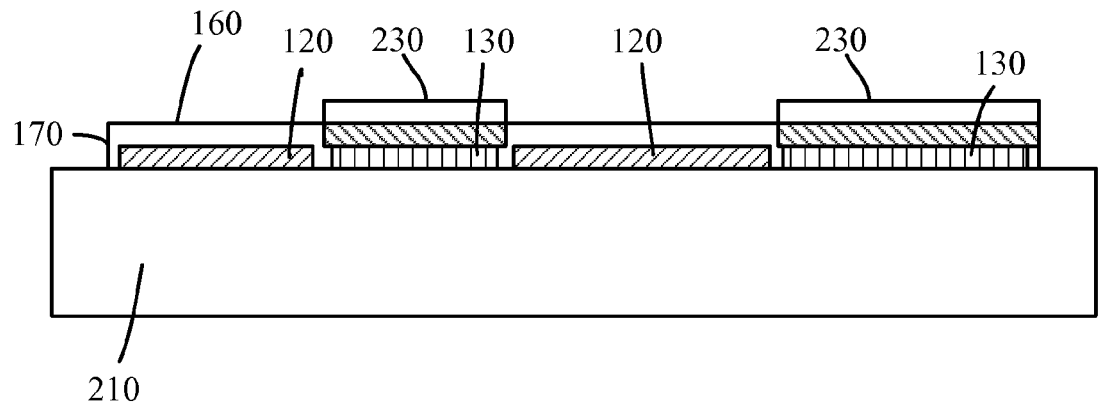

In FIG. 2G, a second pattern 230 may be formed over back surface 160 of substrate 170. Second pattern 230 may selectively cover backside areas opposite PMOS transistor regions 130 while exposing backside areas opposite NMOS transistor regions 120. Second pattern 230 may be formed by a photo-patterning process using a photoresist or a laminate or by a reductive thin film deposition, lithography, and etch process. In one embodiment, wafer support system 210 may be made of glass or other suitable material and second pattern 230 may be aligned to transistor regions 120, 130 by using optical pattern recognition through wafer support system 210. In one embodiment, second pattern 230 may be the inverse of pattern 220. In such an embodiment, the same lithography mask may be used if additive methods are used for one pattern and reductive methods for the other.

Figure 2H:
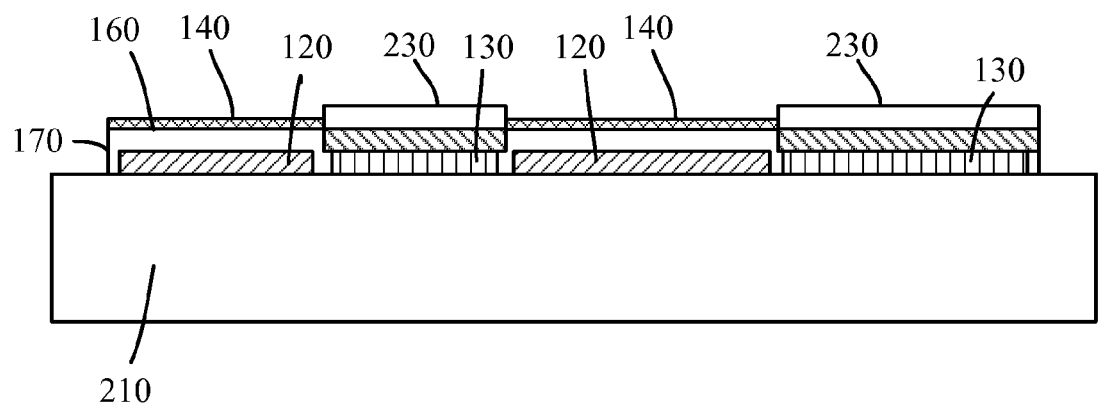
Figure 2I:
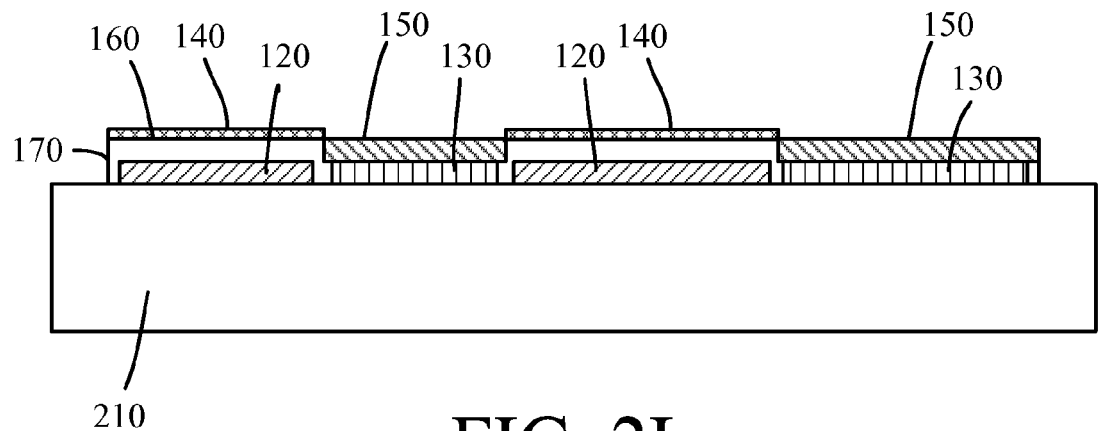

In FIG. 2H, NMOS back side stress engineering areas 140 may be formed opposite NMOS transistor regions 120. NMOS back side stress engineering areas 140 may be formed on back surface 160 (as illustrated) or under back surface 160. In one embodiment, NMOS back side stress engineering areas 140 may include atomic implant or deposition or growth of a thin film. In one embodiment, NMOS back side stress engineering areas 140 may be a nitride thin film that provides a tensile stress in the channel regions of the transistors in NMOS transistor regions 120. Pattern 220 may be removed by known methods, as shown in FIG. 2I, and substrate 170 may be released from wafer support system 210.

In other embodiments of the present invention, the method may accommodate additional transistor regions. Further, other methods for inducing back side stress, for example a Copper layer may be plated at different temperatures in different regions, may be used.

Figure 3:
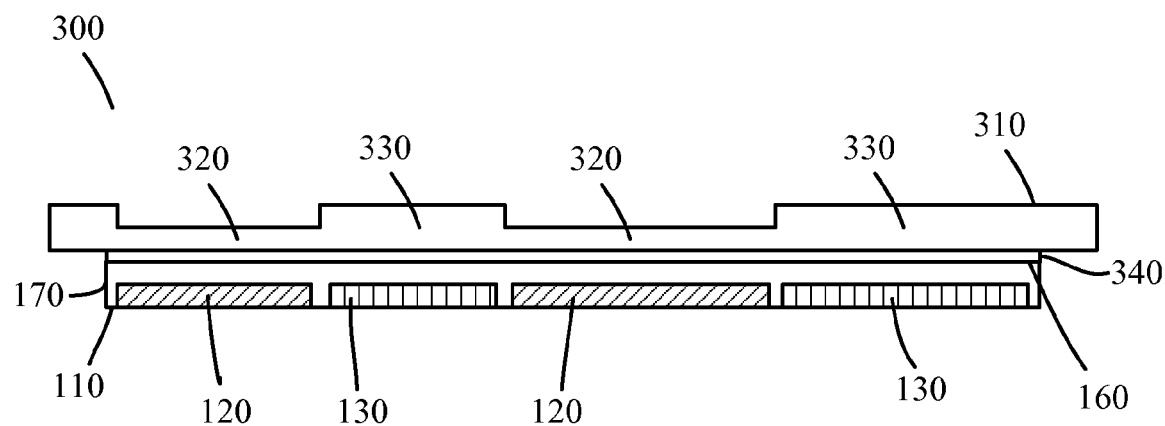
FIG. 3 illustrates a cross sectional type view of an apparatus in accordance with one embodiment of the present invention.

FIG. 3 illustrates a cross-sectional type view of an apparatus 300. Apparatus 300 includes substrate 170 having front surface 110, back surface 160, and an integrated heat spreader 310 attached to back surface 160 by a thermal interface material 320. Front surface 110 may include NMOS transistor regions 120 and PMOS transistor regions 130. Integrated heat spreader 310 includes thin portions 320 adjacent to NMOS transistor regions 120 and thick portions 330 adjacent to PMOS transistor regions 130. Integrated heat spreader 310 may selectively provide back side stress engineering to substrate 170. Specifically, thick portions 330 may provide a greater compressive stress to PMOS transistor regions 130 than thin portions 320 provide to NMOS transistor regions 120. The thickness of thin portions 320 may be in a variety of ranges, including about 0.1 to 1.25 mm, about 0.25 to 1.1 mm, and about 0.5 to 1.0 mm. The thickness of thick portions 330 may be in a variety of ranges, including about 1.25 to 2.75 mm and about 1.5 to 2.5 mm.

In one embodiment, integrated heat spreader 310 may be attached at a high temperature to substrate 170 and integrated heat spreader 310 may be cooled. Cooling integrated heat spreader 310 may cause a compressive stress on substrate 170 and thick portions 330 may provide a greater compressive stress than thin portions 320. In one embodiment, integrated heat spreader 310 includes copper. Thermal interface material 320 may be a stiff material, such as gold-tin, in order to transmit the stress to substrate 170.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. An apparatus comprising:
   a first surface of a substrate having a first transistor type region and a second transistor type region; and
   a heat spreader attached to a substrate surface opposite the first surface, the heat spreader having a portion opposite the first transistor type region that is thinner than a portion opposite the second transistor type region, wherein the portion opposite the first transistor type region is about 0.1 to 1.25 mm thick and the portion opposite the second transistor type region is about 1.25 to 2.75 mm thick.

2. An apparatus comprising:

a first surface of a substrate having a first transistor type region and a second transistor type region; and a heat spreader attached to a substrate surface opposite the first surface, the heat spreader having a portion opposite the first transistor type region that is thinner than a portion opposite the second transistor type region, wherein the portion opposite the first transistor type region is about 0.25 to 1.1 mm thick and the portion opposite the second transistor type region is about 1.25 to 2.75mm thick.

3. An apparatus comprising:

a first surface of a substrate having a first transistor type region and a second transistor type region; and a heat spreader attached to a substrate surface opposite the first surface, the heat spreader having a portion opposite the first transistor type region that is thinner than a portion opposite the second transistor type region, wherein the portion opposite the first transistor type region is about 0.5 to 1.0 mm thick and the portion opposite the second transistor type region is about 1.5 to 2.5 mm thick.

4. The apparatus of claim 3, further comprising:

a thermal interface material between the substrate surface opposite the first surface and the heat spreader.

5. The apparatus of claim 4, wherein the heat spreader includes copper and the thermal interface material includes gold-tin.

* * * * *